(12) United States Patent
Franceschini et al.

(10) Patent No.: US 8,995,217 B2
(45) Date of Patent: Mar. 31, 2015

(54) HYBRID LATCH AND FUSE SCHEME FOR MEMORY REPAIR

(71) Applicant: International Business Machines Corporation, Armonk, NY (US)

(72) Inventors: Michele M. Franceschini, White Plains, NY (US); Hillery C. Hunter, Deerfield, IL (US); Charles A. Kilmer, Essex Junction, VT (US); Kyu-hyoun Kim, Mount Kisco, NY (US); Luis A. Lastras-Montano, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 13/783,729

(22) Filed: Mar. 4, 2013

(65) Prior Publication Data

US 2014/0185398 A1 Jul. 3, 2014

Related U.S. Application Data

(63) Continuation of application No. 13/732,954, filed on Jan. 2, 2013.

(51) Int. Cl.
*G11C 17/18* (2006.01)
*G11C 29/42* (2006.01)
*G11C 29/44* (2006.01)
*G11C 29/04* (2006.01)

(52) U.S. Cl.
CPC ............ *G11C 29/42* (2013.01); *G11C 29/4401* (2013.01); *G11C 17/18* (2013.01); *G11C 2029/0409* (2013.01); *G11C 2029/4402* (2013.01)
USPC ..................... 365/225.7; 365/200; 365/185.09

(58) Field of Classification Search
CPC ...... G11C 17/18; G11C 17/16; G11C 29/785; G11C 17/165; G11C 29/027
USPC ................................ 365/225.7, 200, 185.09
See application file for complete search history.

(56) References Cited

U.S. PATENT DOCUMENTS

| | | | |
|---|---|---|---|
| 6,920,525 B2 | 7/2005 | Chadwick et al. | |
| 7,401,270 B2 | 7/2008 | Hummler | |

(Continued)

OTHER PUBLICATIONS

Anand et al., "An On-Chip Self-Repair Calculation and Fusing Methodology", IEEE Design and Test of Computers, 2003, vol. 20, Issue 5, pp. 67-75, © 2003 IEEE.

(Continued)

*Primary Examiner* — Jason Lappas
(74) *Attorney, Agent, or Firm* — Scott A. Berger; Robert R. Williams

(57) ABSTRACT

A method and apparatus for managing memory in an electronic system is described. The method includes determining a failure in an element of the memory array that is repairable by a redundant element. The method may further include using a latch to identify the redundant element. The method may also include that upon an event, using a value in the latch in an eFuse which subsequently selects the redundant element.

12 Claims, 5 Drawing Sheets

(56) References Cited

U.S. PATENT DOCUMENTS

| | | | |
|---|---|---|---|
| 7,859,934 B2 * | 12/2010 | Taniguchi et al. | ......... 365/225.7 |
| 2003/0067816 A1 | 4/2003 | Anand et al. | |
| 2007/0133323 A1 | 6/2007 | Kim et al. | |
| 2008/0247235 A1 | 10/2008 | Kang | |
| 2009/0027939 A1 | 1/2009 | Kang | |
| 2011/0280091 A1 | 11/2011 | Rooney et al. | |
| 2011/0286278 A1 | 11/2011 | Kang et al. | |
| 2012/0230136 A1 | 9/2012 | Gorman et al. | |

OTHER PUBLICATIONS

Rizzolo et al., "IBM System z9 eFUSE applications and methodology", IBM Journal of Research and Development, Jan./Mar. 2007, vol. 51, No. 1/2, pp. 65-75, © 2007 IBM. Received May 5, 2006, Accepted Oct. 17, 2006, Internet Publication Feb. 13, 2007.

Robson et al., "Electronically Programmable Fuse (eFUSE): From Memory Redundancy to Automatic Chips", IEEE 2007 Custom Integrated Circuits Conference (CICC), pp. 799-804.

\* cited by examiner

HYBRID LATCH AND FUSE SCHEME FOR MEMORY REPAIR

CROSS-REFERENCE TO RELATED APPLICATIONS

This application is a continuation of co-pending U.S. patent application Ser. No. 13/732,954, filed Jan. 2, 2013. The aforementioned related patent application is herein incorporated by reference in its entirety.

TECHNICAL FIELD

The present invention relates generally to the data processing field, and more particularly, relates to sensing the logical state of eFuses.

BACKGROUND

Modern computer systems, such as servers, use a volatile memory in their main memories. The main memory is the place where the computer holds current programs and data that are in use. These programs in the main memory hold the instructions that the processor executes and the data that those instructions work with. The main memory is an important part of the main processing subsystem of the computer, tied in with the processor, cache, motherboard, and chipset allowing the computer system to function.

SUMMARY

In one embodiment, a method is provided for managing memory in an electronic system. The method includes determining a failure in an element of the memory array that is repairable by a redundant element. The method may further include using a latch to identify the redundant element. The method may also include that upon an event, using a value in the latch in an eFuse which subsequently selects the redundant element.

In another embodiment, an apparatus is provided for managing memory in an electronic system. The apparatus includes a memory array containing a redundant element that may be activated using either a latch or an eFuse. The apparatus may further include a first logic module. The logic module may be adapted to, upon the determination of a failure in an element of the memory array that is repairable by a redundant element, use a latch to identify the redundant element. Upon an event the logic module may further use a value in the latch in the eFuse which subsequently selects the redundant element

DETAILED DESCRIPTION

Figure 1:
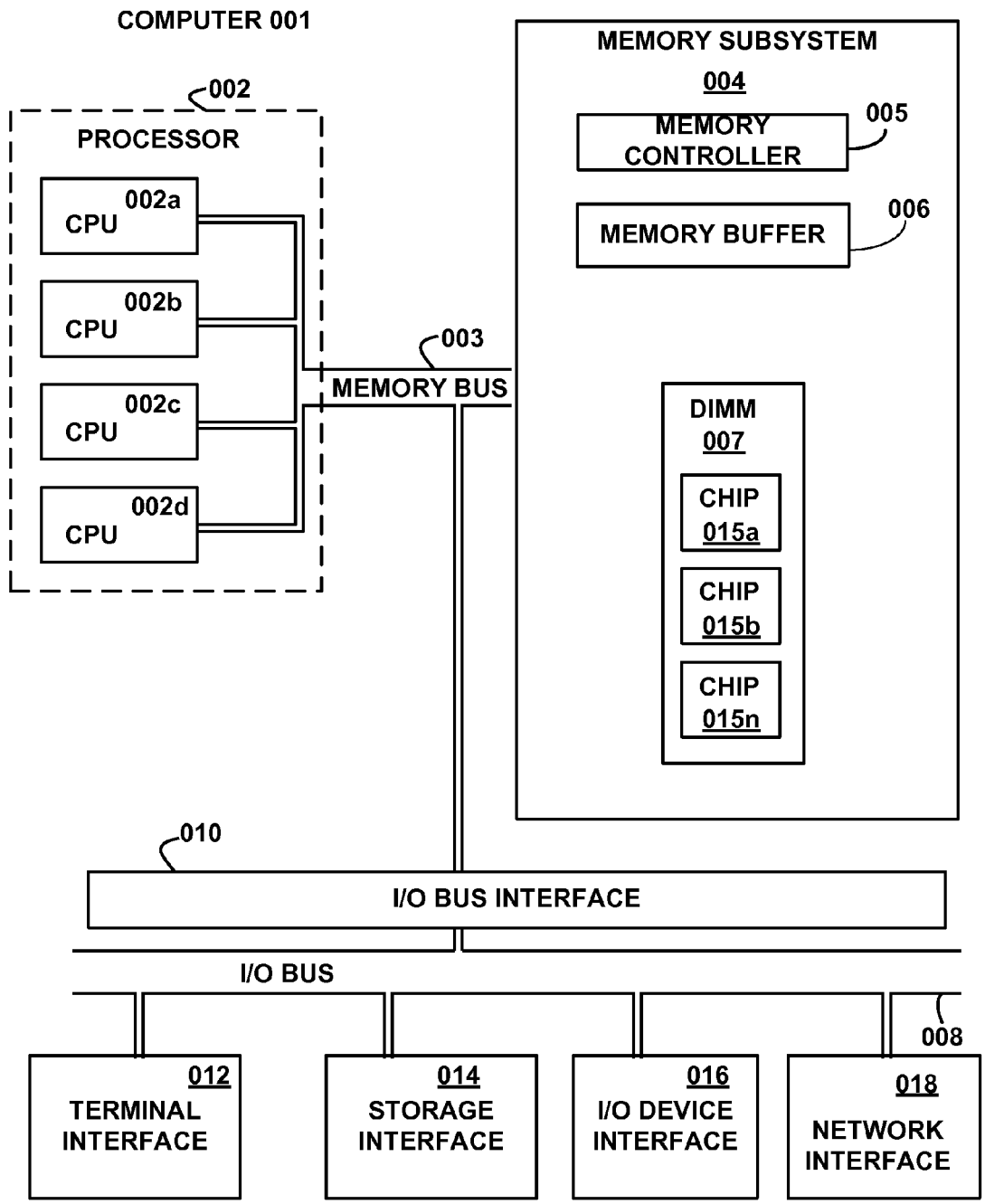
FIG. 1 depicts a high-level block diagram of an exemplary system, according to an embodiment of the invention.

Modern electronic systems, such as servers, may use a memory array in their memory subsystems. The memory subsystem is the place where the computer holds current programs and data that are in use. These programs in the memory subsystem hold the instructions that the processor executes and the data that those instructions work with. The memory arrays within a memory subsystem may be of a variety of types including, but not limited to, dynamic random-access memory (DRAM), Static random-access memory (SRAM), and FLASH memory. One skilled in the art will recognize the variety and types of such memory arrays. The memory arrays may be susceptible to a variety of failures, sometimes called errors. These failures may result from a number of causes and may be "hard failures (permanent) or may be "soft failures" that, if corrected, may not recur. Such failures may be detected by error correction circuits (ECC) or similar error or failure detection.

When a failure is found in the memory array it may be possible to determine if it is a hard or soft failure. In some cases, this can be determined quickly. In other situations, a determination may take further testing. A hard failure may be a failure that is a permanent failure in that it may not be correctable by software, existing hardware in the electronic system, redundant systems, or time. In comparison, a soft failure may be a temporary failure that may be corrected by software, existing hardware in the electronic system, redundant systems, or time. For example, a soft error may be an environmental effect that results in a temporary ionizing event. In another example, the failure may be a hard failure that can not be avoided with the use of spare bits that many memory subsystems may use to handle limited failures in bits of memory devices such as dual in-line memory modules (DIMMs). In many memory arrays ECC hardware or software may correct a single bit error (whether hard or soft) and detect a double bit error. For example, while a hard error in a single bit in a DRAM may be corrected, an additional soft error in the DRAM may then result in an uncorrectable error.

When a failure is found in a memory array the system may reroute work designated to the failed memory array to a redundant element. In one embodiment, the redundant element may be part of a failed memory array. The use of a latch or an eFuse may allow the failed memory array to use the redundant element. The use of the redundant element may allow the memory array to operate properly and be used by the system. In another embodiment, the redundant element may be external to the failed memory unit allowing the system to complete the work originally designated for the failed memory array. In various embodiments, the element may be a word line, a bit line, or a column select line. Other forms of elements would be realized by one skilled in the art.

The use of redundant elements may be activated by a variety of devices in a system. In many memory arrays, two common devices may be used for activating and using redundant elements, such as the eFuses and latches that were previously mentioned. Each of these devices may have advantages and disadvantages in their use. The eFuse, for example, may have the disadvantages of a larger cost, footprint, and irreversibility once activated. Activating an eFuse may be known as burning the eFuse. The burning or activation may also be known as giving the eFuse a value. The eFuse irreversibility may also be an advantage in that it cannot be reset by power loss, for example. The latch, by comparison, may have the advantage of a lower cost, smaller footprint, a fast writing speed, and reversibility. The reversibility of a latch, though, may also be a disadvantage as power outage may change a setting in the latch requiring the rediscovery of a failure, previously corrected by the latch, with every reboot. The latch may also need to be reset or reprogrammed with each reboot using power and resources. The presented embodiment shown herein shows the use of latches to repair failures on a short term basis and eFuses to repair the failure upon the occurrence of an event recognized by the system, making the repair long term or permanent.

FIG. 1 depicts a high-level block diagram of an exemplary system for implementing an embodiment of the invention. The mechanisms and apparatus of embodiments of the present invention apply equally to any appropriate computing system. The major components of the computer system 001 comprise one or more CPUs 002, a memory subsystem 004, a terminal interface 012, a storage interface 014, an I/O (Input/Output) device interface 016, and a network interface 018, all of which are communicatively coupled, directly or indirectly, for inter-component communication via a memory bus 003, an I/O bus 008, and an I/O bus interface unit 010.

The computer system 001 may contain one or more general-purpose programmable central processing units (CPUs) 002A, 002B, 002C, and 002D, herein generically referred to as the CPU 002. In an embodiment, the computer system 001 may contain multiple processors typical of a relatively large system; however, in another embodiment the computer system 001 may alternatively be a single CPU system. Each CPU 002 executes instructions stored in the memory subsystem 004 and may comprise one or more levels of on-board cache.

In an embodiment, the memory subsystem 004 may comprise a random-access semiconductor memory, storage device, or storage medium (either volatile or non-volatile) for storing data and programs. In another embodiment, the memory subsystem 004 may represent the entire virtual memory of the computer system 001, and may also include the virtual memory of other computer systems coupled to the computer system 001 or connected via a network. The memory subsystem 004 may be conceptually a single monolithic entity, but in other embodiments the memory subsystem 004 may be a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory or memory subsystem 004 may contain elements for control and flow of memory used by the CPU 002. This may include all or a portion of the following: a memory controller 005, one or more memory buffer 006 and one or more memory devices 007. In the illustrated embodiment, the memory devices 007 may be dual in-line memory modules (DIMMs), which are a series of dynamic random-access memory (DRAM) chips 015a-015n (collectively referred to as 015) mounted on a printed circuit board and designed for use in personal computers, workstations, and servers. The use of DRAMs 015 in the illustration is exemplary only and the memory array used may vary in type as previously mentioned. In various embodiments, these elements may be connected with buses for communication of data and instructions. In other embodiments, these elements may be combined into single chips that perform multiple duties or integrated into various types of memory modules. The illustrated elements are shown as being contained within the memory subsystem 004 in the computer system 001. In other embodiments the components may be arranged differently and have a variety of configurations. For example, the memory controller 005 may be on the CPU 002 side of the memory bus 003. In other embodiments, some or all of them may be on different computer systems and may be accessed remotely, e.g., via a network.

Although the memory bus 003 is shown in FIG. 1 as a single bus structure providing a direct communication path among the CPUs 002, the memory subsystem 004, and the I/O bus interface 010, the memory bus 003 may in fact comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 010 and the I/O bus 008 are shown as single respective units, the computer system 001 may, in fact, contain multiple I/O bus interface units 010, multiple I/O buses 008, or both. While multiple I/O interface units are shown, which separate the I/O bus 008 from various communications paths running to the various I/O devices, in other embodiments some or all of the I/O devices are connected directly to one or more system I/O buses.

In various embodiments, the computer system 001 is a multi-user mainframe computer system, a single-user system, or a server computer or similar device that has little or no direct user interface, but receives requests from other computer systems (clients). In other embodiments, the computer system 001 is implemented as a desktop computer, portable computer, laptop or notebook computer, tablet computer, pocket computer, telephone, smart phone, network switches or routers, or any other appropriate type of electronic device.

FIG. 1 is intended to depict the representative major components of an exemplary computer system 001. But individual components may have greater complexity than represented in FIG. 1, components other than or in addition to those shown in FIG. 1 may be present, and the number, type, and configuration of such components may vary. Several particular examples of such complexities or additional variations are disclosed herein. The particular examples disclosed are for example only and are not necessarily the only such variations.

The memory buffer 006, in this embodiment, may be intelligent memory buffer, each of which includes an exemplary type of logic module. Such logic modules may include hardware, firmware, or both for a variety of operations and tasks, examples of which include: data buffering, data splitting, and data routing. The logic module for memory buffer 006 may control the DIMMs 007, the data flow between the DIMM 007 and memory buffer 006, and data flow with outside elements, such as the memory controller 005. Outside elements, such as the memory controller 005 may have their own logic modules that the logic module of memory buffer 006 interacts with. The logic modules may be used for failure detection and correcting techniques for failures that may occur in the DIMMs 007. Examples of such techniques include: Error Correcting Code (ECC), Built-In-Self-Test (BIST), extended exercisers, and scrub functions. The firmware or hardware may add additional sections of data for failure determination as the data is passed through the system. Logic modules throughout the system, including but not limited to the memory buffer 006, memory controller 005, CPU 002, and even the DRAM 0015 may use these techniques in the same or different forms. These logic modules may communicate failures and changes to memory usage to a hypervisor or operating system. The hypervisor or the operating system may be a system that is used to map memory in the system 001 and tracks the location of data in memory systems used by the CPU 002. In embodiments that combine or rearrange elements, aspects of the firmware, hardware, or logic modules capabilities may be combined or redistributed. These variations would be apparent to one skilled in the art.

Figure 2:
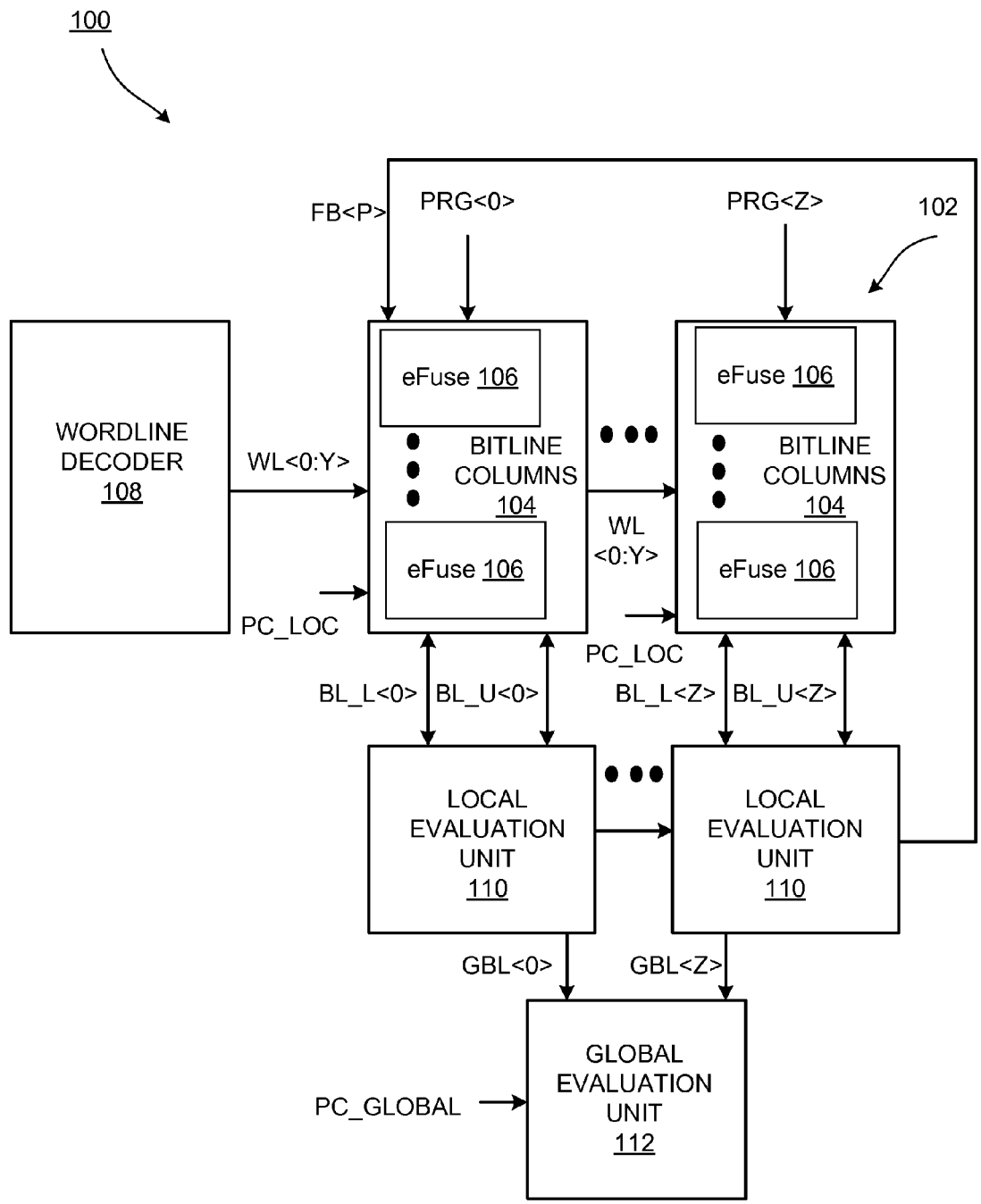
FIG. 2 is a schematic diagram illustrating an exemplary eFuse array according to an embodiment of the invention.

FIG. 2 illustrates one embodiment of a schematic diagram of an eFuse array 100. In electronics, an eFuse array 100 is a technology that allows for the dynamic real-time reprogramming of circuits. Generally speaking, circuit logic is generally 'etched' or 'hard-coded' onto a semiconductor device and cannot be changed after the device has finished being manufactured. By incorporating an eFuse array 100, a semiconductor device manufacturer may allow for the circuits on a device to change while the device is in operation. The hard coded nature of the eFuse array 100 may provide an advantage with hard failures. Since such failures may be irreversible the hard coding of use of redundant elements in DRAM 015 means that the correction may be saved when power is lost or a reboot occurs. For a soft failure the use of a eFuse 106 for failure correction may mean that use of redundant elements or resources may be irreversible even if the condition that caused the need to use them ends.

The eFuse array 100 may include an eFuse circuit 102 including one or more bitline columns 104. The bitline columns 104 may include an upper bitline and a lower bitline. Each bitline may be coupled to one or more eFuses 106. The upper and lower bitlines may each be coupled to a pre-charge device. The pre-charge device may receive pre-charge signal PC_LOC. PC_LOC may cause the pre-charge device to provide a signal BL_U to the upper bitline and a signal BL_L to the lower bitline.

The eFuse array 100 may include a wordline decoder 108. The wordline decoder 108 may provide a wordline signal, WL<0:Y>, to address the multiple eFuses 106. Also, each bitline column 104 may receive a program signal, PRG<0>-PRG<Z>. PRG<0>-PRG<Z> may signal each eFuse 106 to burn.

The eFuse array 100 also may include one or more local evaluation units 110. The local evaluation units 110 may receive bitline signals BL_U and BL_L on the upper and lower bitlines. The local evaluation units 110 may determine if an eFuse is blown or unblown from the signals BL_U and BL_L. The local evaluation unit 110 may also help maintain a signal on the upper and lower bitlines. The local evaluation units 110 may provide signals GBL<0>-GBL<Z> to a global evaluation unit 112 to determine logical state of the eFuses. The eFuse circuit 102 may also receive a feedback signal FB<P> from the local evaluation units 110. The FB<P> may be used to correctly sense a blown eFuse by keeping WL<0:Y> active long enough to sense an unblown eFuse.

Figure 3:
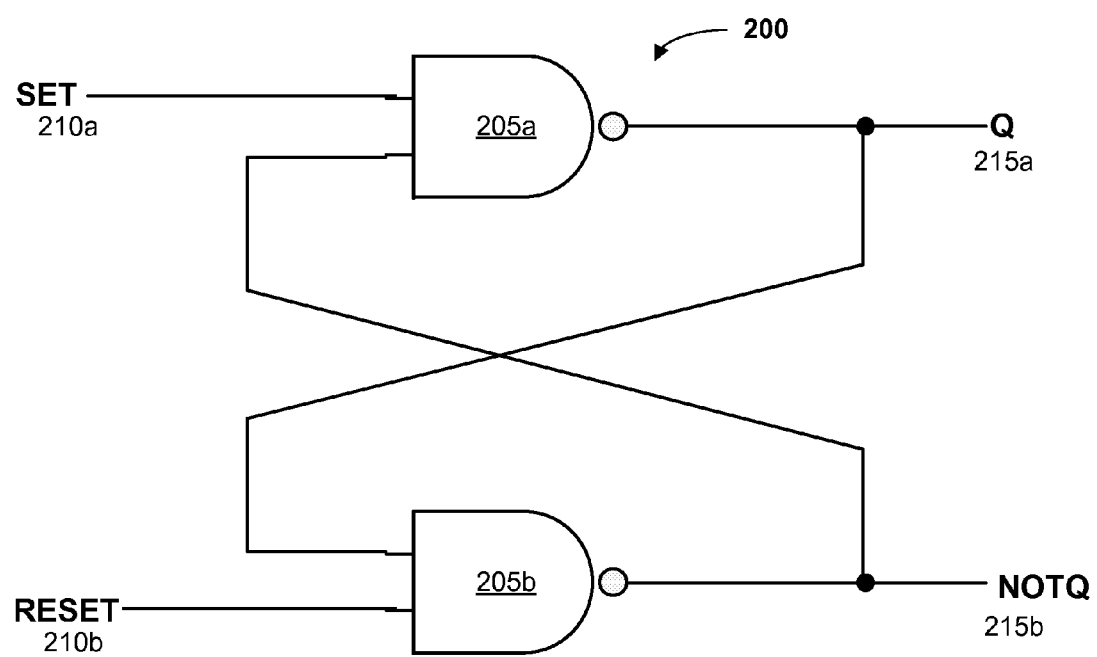
FIG. 3 is a schematic diagram illustrating an exemplary latch according to an embodiment of the invention.

FIG. 3 is a exemplary embodiment of a latch 200. A latch 200 is a digital electronic logic circuit which, upon receiving an instruction to change its output, will "latch" the output, so that the output does not change even after the input has been removed. A latch 200 may be a type of volatile data storage. If power is lost to the system or a reboot occurs the latch 200 may reset and information stored by it may be lost. A latch 200 may be used for failure correction in DRAM 0015. If the failure is a soft failure the latch 200 may be purposely reset to use the original element once the condition causing the failure has been eliminated. For hard failure, though, the setting of a latch may need to be repeated with every power interruption or reboot.

The illustrated latch 200 is a S/R style latch using two NAND 205a and 205b gates and has two inputs and two outputs. The two inputs are labeled "S Set" 210a and "Reset" 210b. Set 210a, when enabled, may turn on the latch 200, and Reset 215 may turn it off. The two outputs are labeled "Q" 215a and "NOTQ" 215b. Q 215a may be the main output for the latch 200. In other embodiments, the latch may use NOR gates.

Figure 4:
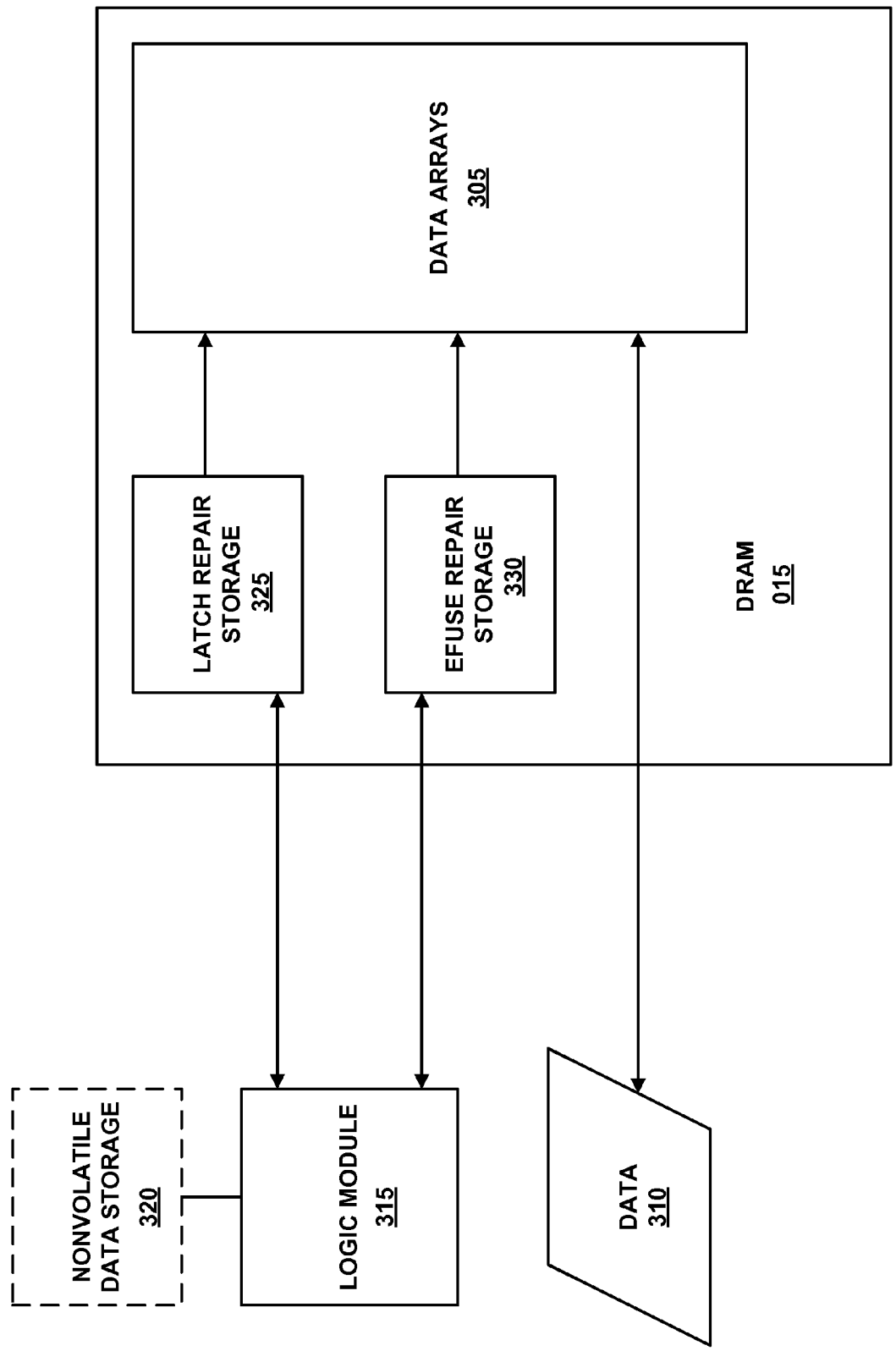
FIG. 4 is a block diagram of an embodiment of the invention, according to an embodiment of the invention.

FIG. 4 is a block diagram of an embodiment of the invention. The DRAM 015 contains data arrays 305 for storing data 310. The DRAM also contains both a latch repair storage 325 and eFuse repair storage 330. This embodiment may allow for the use of both latches 200 and eFuses 106, thus the DRAM 015 may have one or more of each available. The latch repair storage 325 would contain one or more latches 200 (FIG. 3) that may be used to select a redundant element in the DRAM 015 upon the finding of a failure in the DRAM 015 that is repairable by a redundant element. The DRAM 015 may also have an eFuse repair storage 330 that contains one or more eFuses 106 (FIG. 2). The eFuse storage 330 may contain in whole or part the effuse array 100 or eFuse circuit 102 in various embodiments. The eFuses 106 may be used for selection of redundant elements in the DRAM 015 if an event occurs. In various embodiments, the latch repair storage 325 and the eFuse repair storage 330 may hold non-equivalent numbers of latches 200 and eFuses 106.

The latch repair storage and the eFuse repair storage may be connected to a logic module 315. The logic module 315 may contain the hardware and programming that determines upon a failure if the latch repair storage or the eFuse repair storage is used for repairing a failed element by using a redundant element. The logic module 315 may also contain hardware or programming that determines when an event occurs that a value in a latch 200 may be transferred to an eFuse 106.

For example, a failure occurs in an element within the DRAM 015. The failure may not be immediately determinable to be a hard error. The logic module may assign a value to a latch 200 in the latch repair storage 325 so that a redundant element is selected in the DRAM 015 thus repairing the failure. If an event occurs, the logic module 315 may transfer the value in the latch over to an eFuse 106 within the eFuse repair storage 330 so that the selection of the redundant element for repair may become permanent.

The event that may result in the transfer from latch 200 to eFuse 106 may have many embodiments. In one embodiment, the event may be the finding of the same failure upon a reboot of the system. An embodiment that involves a system reboot or writing after a power outage may use optional nonvolatile data storage 320 that is not an eFuse 106. For example, nonvolatile data storage 320 may be a hard disk, a flash memory, or other known nonvolatile data storage. The nonvolatile data storage 320 may contain history or information used by the logic module 315 to determine an event has occurred that may result in the value in a latch being transferred to an eFuse 106 by burning the eFuse 106. When the failure is first found it may be repaired by using latch 200 to reroute the system through a redundant element. When this occurs the need to use the latch 200 for this purpose may be recorded and stored in the nonvolatile data storage 320. When power is lost, such as during a reboot, and the same failure occurs the logic module 315 may see the failure has repeated based on information from the nonvolatile data storage 320. The logic module may be programmed that the repeat of a failure is an event that results in burning the correction into an eFuse 106. This may prevent the entire cycle of failure and setting or using a latch to be prevented for each subsequent power outage or reboot.

In other embodiments, the logic module 315 may have a variety of events that result in the transfer of the value in the latch 200 to an eFuse 106. The determination that the failure found is a hard failure may result in the use of the eFuse 106 in one embodiment. In another embodiment, the event may be a period of low memory usage. The burning of an eFuse 106 may require high power or memory usage making it preferable to do during periods of low demand on the system. In another embodiment, the event may be a signal received at the DRAM 015. This may be from a variety of sources such as the CPU 002, Memory buffer 006, memory controller 005, or from software such as ECC software. The signal may in some embodiments be user generated. One skilled in the art will realize the variety, forms, and reasons such a signal may be received. In another embodiment, the event may be a determination by the logic module 315, other system within the DRAM 015, or computer 001 that the redundant element is fully functional. Other events that may result in a transfer from the use of a latch 200 to an eFuse 106 would be realized by one skilled in the art.

In other embodiments, the use of a latch 200 and then the eFuse 106 by the logic module 315 may be used to reverse the selection of a redundant element by another eFuse 106. This use of an eFuse 106 may be done for example if the failed element was replaced or repaired but replacement of the burned eFuse 106 may not have been practical.

Figure 5:
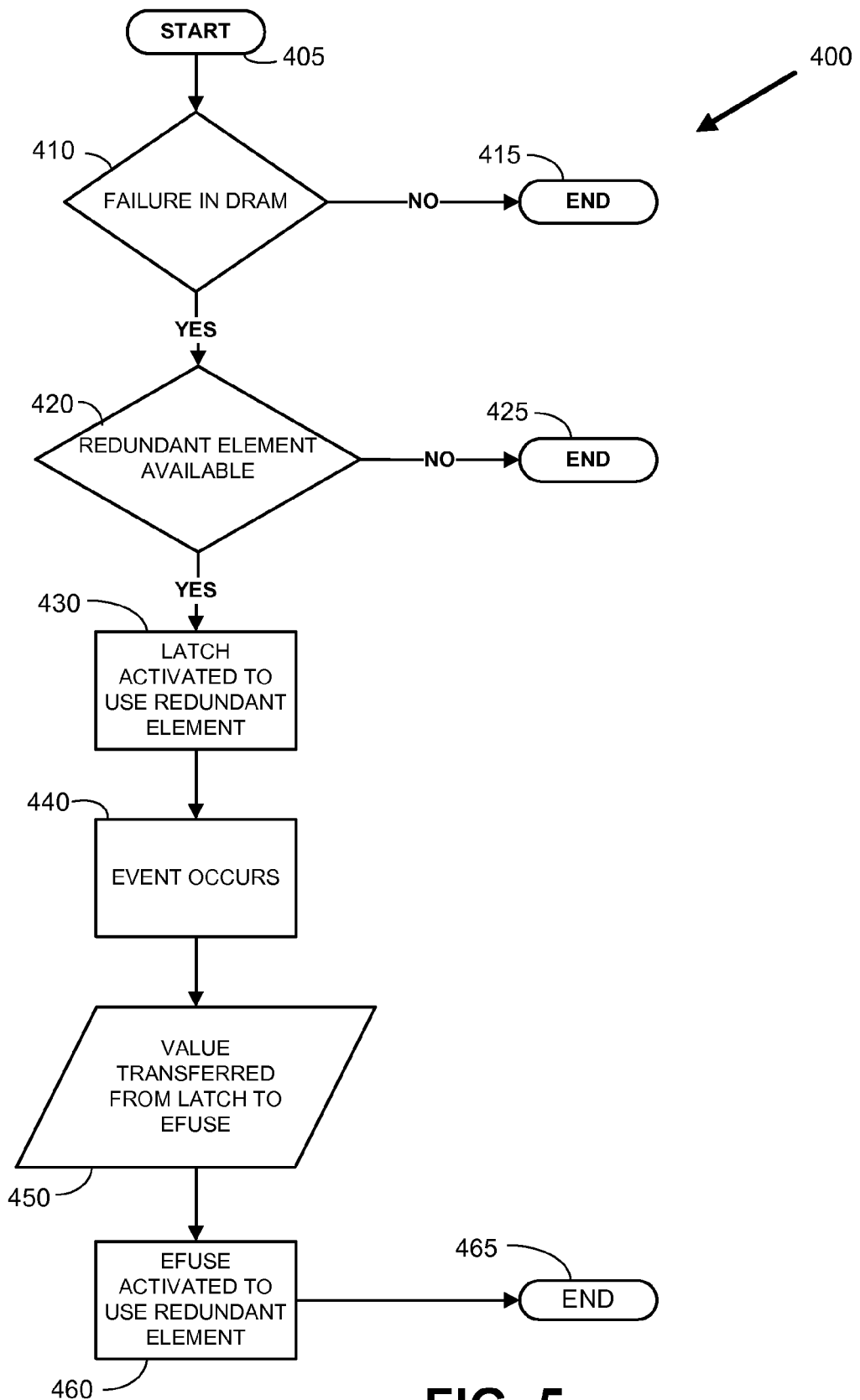
FIG. 5 is a flowchart of a method, according to an embodiment of the invention.

FIG. 5 is a flowchart of a method 400 to allow the system to transfer a value enabling the use of a redundant element to repair a failure from a latch 200 to an eFuse 106. In FIG. 5, the method 400 begins at block 405. At block 410, a check for a failure within a DRAM 015 may occur. This determination of a failure may use the previously mentioned ways of finding errors in memory systems such as ECC. If no failure is found the method may end at block 415. If a failure is found in block 410 then the method may proceed to block 420. In block 420, a determination is made if the failure may be corrected by a redundant element and if a redundant element is available. This may be done by the same software or hardware that finds the failure or by other software or hardware. If the failure can not be corrected by a redundant element or if a redundant element is not available the method may proceed to block 425 and end.

If the failure may be corrected by a redundant element and the redundant element is available the method may proceed to block 430. In block 430 the method activates a latch 200 that allows the use of the redundant element that may correct the failure. At block 440 an event occurs. This event may be the same events or of a similar type mentioned previously. The method may proceed to block 450 where the value is transferred from the latch 200 to the eFuse 106. As previously mentioned, this may be referred to as a value transfer or a burning of the eFuse. In block 460, the eFuse 106 may be active to use the redundant element previously activated using the latch 200. The method may then end at block 465.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope and spirit of the disclosed subject matter.

What is claimed is:

1. An apparatus for managing memory in an electronic system comprising: a memory array containing a redundant element that may be activated using either a latch or an eFuse; a logic module, that is adapted to, upon the determination of a failure in an element of the memory array that is repairable by a redundant element uses a latch to identify the redundant element, and upon an event, transferring a value from the latch to the eFuse, which subsequently selects the redundant element; a nonvolatile data storage for failure information, the nonvolatile data storage not being an eFuse; upon reboot, if the failure persists based upon data in the nonvolatile data storage, burning an eFuse which is subsequently used to select the redundant element.

2. The apparatus of claim 1, wherein the event is a detection of a period of low memory use in the electronic system.

3. The apparatus of claim 1, wherein the event is a determination that the failure in the element is a hard failure.

4. The apparatus of claim 1, wherein the event is a signal received at the memory array.

5. The apparatus of claim 1, wherein the event is a determination that the redundant element is fully functional.

6. The apparatus of claim 1, wherein the element is a word line.

7. The apparatus of claim 1, wherein the element is a bit line.

8. The apparatus of claim 1, wherein the element is a column select line.

9. The apparatus of claim 1, wherein the memory array is a dynamic random-access memory (DRAM).

10. The apparatus of claim 1, wherein the logic module is programmed to transfer the value from the latch to the eFuse upon the repeat of a failure in a latch.

11. The apparatus of claim 1, wherein the logic module is used to reverse the selection of the redundant element by another eFuse.

12. The apparatus of claim 1, wherein the event is the finding of the same failure as a previous failure in an element upon reboot of a system.

* * * * *